(12) United States Patent
Cen et al.

(10) Patent No.: US 11,025,262 B1
(45) Date of Patent: Jun. 1, 2021

(54) PIPELINED ANALOG-TO-DIGITAL CONVERTER

(71) Applicant: CHENGDU HUAWEI ELECTRONIC TECHNOLOGY CO., LTD., Chengdu (CN)

(72) Inventors: Yuanjun Cen, Chengdu (CN); Xing Zhu, Chengdu (CN); Jinda Yang, Chengdu (CN)

(*) Notice: Subject to any disclaimer, the term of this patent is extended or adjusted under 35 U.S.C. 154(b) by 0 days.

(21) Appl. No.: 17/037,865

(22) Filed: Sep. 30, 2020

(51) Int. Cl.
*H03M 1/10* (2006.01)

(52) U.S. Cl.
CPC ........... *H03M 1/1014* (2013.01); *H03M 1/10* (2013.01); *H03M 1/1009* (2013.01)

(58) Field of Classification Search
CPC ..... H03M 1/1014; H03M 1/1009; H03M 1/10
See application file for complete search history.

(56) References Cited

U.S. PATENT DOCUMENTS

| | | | | |
|---|---|---|---|---|
| 5,668,549 A * | 9/1997 | Opris | ..................... | H03M 1/069 341/118 |
| 6,501,400 B2 * | 12/2002 | Ali | ..................... | H03M 1/0604 341/118 |
| 6,784,814 B1 * | 8/2004 | Nair | ..................... | H03M 1/0641 341/118 |
| 8,502,713 B1 * | 8/2013 | Lin | ..................... | H03M 1/0607 341/118 |
| 10,541,704 B2 | 1/2020 | Wu | | |
| 2010/0182179 A1 | 7/2010 | Chou | | |
| 2011/0285563 A1 | 11/2011 | Chen et al. | | |

FOREIGN PATENT DOCUMENTS

| | | |
|---|---|---|
| CN | 106936430 A | 7/2017 |
| CN | 107994903 A | 5/2018 |

* cited by examiner

*Primary Examiner* — Brian K Young
(74) *Attorney, Agent, or Firm* — Erson IP(Nelson IP)

(57) ABSTRACT

The disclosure belongs to the field of integrated circuit technologies, and particularly relates to a pipelined analog-to-digital converter capable of correcting capacitor mismatch and inter-stage gain errors. According to the disclosure, a PN code is injected into a digital domain or an analog domain of a pipelined sub-analog-to-digital converter, a mean value of codes outputted by a sub-analog-to-digital converter of an $(i+1)^{th}$ pipeline stage in two cases that a PN code is equal to +1 and the PN code is equal to −1 is counted under the condition that a code outputted by a sub-analog-to-digital converter of an $i^{th}$ pipeline stage is b, and a capacitor mismatch error and an actual inter-stage gain of the $i^{th}$ pipeline stage are estimated according to the mean value and a relationship between a capacitor mismatch error and an actual inter-stage gain error of a previous pipeline stage.

4 Claims, 3 Drawing Sheets

PIPELINED ANALOG-TO-DIGITAL CONVERTER

CROSS-REFERENCE TO RELATED APPLICATIONS

This application claims priority to Chinese Patent Application No. 202010472320.2 with a filing date of May 29, 2020. The content of the aforementioned applications, including any intervening amendments thereto, are incorporated herein by reference.

TECHNICAL FIELD

The disclosure belongs to the field of integrated circuit technologies, and particularly relates to a pipelined analog-to-digital converter capable of correcting capacitor mismatch and inter-stage gain errors.

BACKGROUND

Analog-to-digital converters are circuit modules that convert analog signals into digital signals, which are widely used in various fields, such as audio and video acquisition, high-definition image processing, communication systems, etc. Different fields have different requirements for the performance of the analog-to-digital converter, so analog-to-digital converters of different structures have been developed. A pipelined analog-to-digital converters (Pipeline ADC) is widely used since it integrates the two important characteristics of speed and precision in analogue-to-digital converter application. The pipelined analog-to-digital converter is formed by cascading a series of high-speed low-precision sub-analog-to-digital converters (sub-ADC) with similar structures. For each pipeline stage, after an input signal is sampled and quantized by the sub-analog-to-digital converter, a residual is amplified as an input of next pipeline stage, so that multiple pipeline stages are connected and work at the same time, thus realizing high-speed high-precision conversion between analog signals and digital signals.

FIG. 1 shows a basic architecture of a typical two-pipeline stage pipelined analog-to-digital converter. Each pipeline stage of pipelined analog-to-digital converter comprises a sub-analog-to-digital converter 101 (201), a sub-digital-to-analog converter 102, a subtractor 103 and an amplifier 104. A capacitor digital-to-analog converter (DAC) is a frequently used sub-digital-to-analog converter. There are two structures in the prior art: a binary code type and a thermometer code type. Due to process problems, an actual capacitor value of the capacitor digital-to-analog converter is deviated, which leads to an output error of the sub-digital-to-analog converter. Meanwhile, an amplification factor of the amplifier will also be deviated. Eventually, capacitor mismatch and inter-stage gain errors lead to the degradation of spurious-free dynamic range (SFDR) and signal-to-noise ratio (SNDR).

SUMMARY

A major objective of the disclosure is to provide a pipelined analog-to-digital converter capable of correcting capacitor mismatch and inter-stage gain errors directed to capacitor mismatch of a binary code type and inter-stage gain errors of a digital-to-analog converter, which can improve a performance of the pipelined analog-to-digital converter without interrupting normal operation of the pipelined analog-to-digital converter.

In order to achieve the objective of the disclosure, the disclosure provides a pipelined analog-to-digital converter, comprising a PN code injection module, a digital correction module and a plurality of pipeline stages which are coupled in a cascade mode, wherein each pipeline stage comprises a sub-analog-to-digital converter, a sub-digital-to-analog converter and an inter-stage gain amplifier, and the sub-digital-to-analog converter is of a binary code type;

a PN code generator and a digital correction circuit are arranged between every two adjacent pipeline stages; the previous pipeline stage is an $i^{th}$ stage of the pipelined analog-to-digital converter, and the adjacent next pipeline stage is an $(i+1)^{th}$ stage of the pipelined analog-to-digital converter, wherein $1 \leq i \leq N$, N is a number of the pipeline stages, and $N \geq 1$; and both a number of the PN code generator and a number of the digital correction circuit are N;

the PN code generator between the $i^{th}$ pipeline stage and the $(i+1)^{th}$ pipeline stage is used for randomly generating a PN code and inputting the PN code into the $i^{th}$ pipeline stage, wherein a numerical value of the PN code is +1 or −1; and the PN code is inputted into the $i^{th}$ pipeline stage in a digital signal mode or in an analog signal mode;

if the PN code is inputted into the $i^{th}$ pipeline stage in the digital signal mode, the sub-analog-to-digital converter of the $i^{th}$ pipeline stage converts an analog input signal of the $i^{th}$ pipeline stage into a code, and a digital signal obtained by adding the PN code outputted by the PN code generator and the code outputted by the sub-analog-to-digital converter of the $i^{th}$ pipeline stage serves as an input signal of the sub-digital-to-analog converter of the $i^{th}$ pipeline stage, and a difference between the analog input signal of the $i^{th}$ pipeline stage and an analog output signal of the sub-digital-to-analog converter of the $i^{th}$ pipeline stage after being amplified by the inter-stage gain amplifier of the $i^{th}$ pipeline stage is outputted to the $(i+1)^{th}$ pipeline stage and serves as an analog input signal of the $(i+1)^{th}$ pipeline stage;

if the PN code is inputted into the $i^{th}$ pipeline stage in the analog signal mode, the sub-analog-to-digital converter of the $i^{th}$ pipeline stage converts the analog input signal of the $i^{th}$ pipeline stage into a code and outputs the code to the sub-digital-to-analog converter of the $i^{th}$ pipeline stage; the analog input signal of the $i^{th}$ pipeline stage minus the analog output signal of the sub-digital-to-analog converter of the $i^{th}$ pipeline stage is a quantization residual of the $i^{th}$ pipeline stage, and an analog signal obtained by performing digital-to-analogue conversion on the PN code outputted by the PN code generator is inputted into the $i^{th}$ pipeline stage to increase or decrease the quantization residual, wherein an increase or decrease amplitude is an amplitude of a least significant bit of the sub-analog-to-digital converter of the $i^{th}$ pipeline stage after being converted by the inter-stage gain amplifier and serves, as the analog input signal of the $(i+1)^{th}$ pipeline stage; and the digital correction circuit receives the PN code outputted by the PN code generator, the code outputted by the sub-analog-to-digital converter of the $i^{th}$ pipeline stage and the code outputted by the sub-analog-to-digital converter of the $(i+1)^{th}$ pipeline stage, and counts a mean value of the codes outputted by the sub-analog-to-digital converter of the $(i+1)^{th}$ pipeline stage in two cases that the PN code is equal to +1 and the PN code is equal to −1 under the condition that an output of the sub-analog-to-digital converter of the $i^{th}$ pipeline stage is a code b, wherein b represents the code outputted by the sub-analog-to-digital converter of the $i^{th}$ pipeline stage, k is a binary digit of the code outputted by the sub-analog-to-digital converter of the $i^{th}$ pipeline stage, estimating a capacitor mismatch error and an actual inter-stage gain of the $i^{th}$ pipeline stage according to the mean value of the codes outputted by the sub-analog-to-digital converter of the $(i+1)^{th}$ pipeline stage and a relationship between the capacitor mismatch error and the actual inter-stage gain error of the $i^{th}$ pipeline stage, and performing capacitor mismatch and inter-stage gain error correction on the code outputted at the sub-analog-to-digital converter of the $(i+1)^{th}$ pipeline stage.

Further, the digital correction circuit comprises an error detection circuit and an error correction circuit, wherein the error detection circuit is used for counting the mean value of the codes outputted by the sub-analog-to-digital converter of the $(i+1)^{th}$ pipeline stage in the two cases that the PN code is equal to +1 and the PN code is equal to −1 under the condition that an output of the sub-analog-to-digital converter of the $i^{th}$ pipeline stage is a code b, and estimating the capacitor mismatch error and the actual inter-stage gain of the $i^{th}$ pipeline stage according to the mean value of the codes outputted by the sub-analog-to-digital converter of the $(i+1)^{th}$ pipeline stage and the relationship between the capacitor mismatch error and the actual inter-stage gain error of the $i^{th}$ pipeline stage; and the error correction circuit is used for performing the capacitor mismatch and inter-stage gain error correction on the code outputted by the sub-analog-to-digital converter of the $(i+1)^{th}$ pipeline stage by employing the capacitor mismatch error and the actual inter-stage gain obtained by the error detection circuit.

Further, the error detection circuit comprises a first memory, a second memory, a third memory, an error calculation module and a control module; in a first accumulated time period, under the control of the control module, the PN code equal to +1 is taken as a chip select signal of the first memory, and the code outputted by the sub-analog-to-digital converter of the $(i+1)^{th}$ pipeline stage when the PN code is equal to +1 is stored in a row taking the code outputted by the sub-analog-to-digital converter of the $i^{th}$ pipeline stage as a row address in the first memory; the PN code equal to −1 is taken as a chip select signal of the second memory, and the code outputted by the sub-analog-to-digital converter of the $(i+1)^{th}$ pipeline stage when the PN code is equal to −1 is stored in a row taking the code outputted by the sub-analog-to-digital converter of the $i^{th}$ pipeline stage as a row address in the second memory; the error calculation module reads the first memory and the second memory at a first time interval under the control of the control module, calculates a mean value of codes in each row of the first memory and a mean value of codes in each row of the second memory, estimates the capacitor mismatch error and the actual inter-stage gain by using the two mean values with the same row address of the first memory and the second memory, and stores the capacitor mismatch error and the actual inter-stage gain in the third memory for the error correction circuit to call; and the control module is used for controlling a duration for the first memory and the second memory to store the sub-analog-to-digital converter of the $(i+1)^{th}$ pipeline stage according to the first accumulated time, and controlling a frequency for the error calculation module to calculate and update the capacitor mismatch error and the actual inter-stage gain according to the first time interval.

Further, the error correction circuit comprises a subtractor, an adder, a multiplier, an amplifier and a divider, wherein an amplification factor of the amplifier is equal to an ideal inter-stage gain of the inter-stage gain amplifier of the $i^{th}$ pipeline stage, and a divisor of the divider is equal to the calculated actual inter-stage gain of the inter-stage gain amplifier of the $i^{th}$ pipeline stage;

the code outputted by the sub-analog-to-digital converter of the $i^{th}$ pipeline stage is, sent to a minuend terminal of the subtractor, the calculated capacitor mismatch error is sent to a subtrahend terminal of the subtractor, and an output of the subtractor is sent to the adder; the PN code and the calculated actual inter-stage gain of the $i^{th}$ pipeline stage are sent to the multiplier for multiplication, and an output of the multiplier is sent to the adder and added with the output of the subtractor; and after an output of the adder passes through the amplifier and divider, the corrected code is outputted.

Beneficial Effects

According to the pipelined analog-to-digital converter of the disclosure, the capacitor mismatch and inter-stage gain errors are corrected by injecting the PN code, and meanwhile, an operation time interval and an accumulated time of correction can be flexibly adjusted according to the actual situation, thereby realizing flexible adjustment of a correction precision, a tracking speed and a power consumption. Compared with the prior art, the disclosure has the advantages of high correction precision, fast convergence time and faster tracking speed of error changes.

DETAILED DESCRIPTION

The embodiments of the disclosure will be further described hereinafter in detail with reference to the drawings.

A pipelined analog-to-digital converter has N pipeline stages in total, wherein N≥1, each pipeline stage comprises a sub-analog-to-digital converter, a sub-digital-to-analog converter, a subtractor and an inter-stage gain amplifier, and the sub-digital-to-analog converter is of a binary code type.

Figure 1:
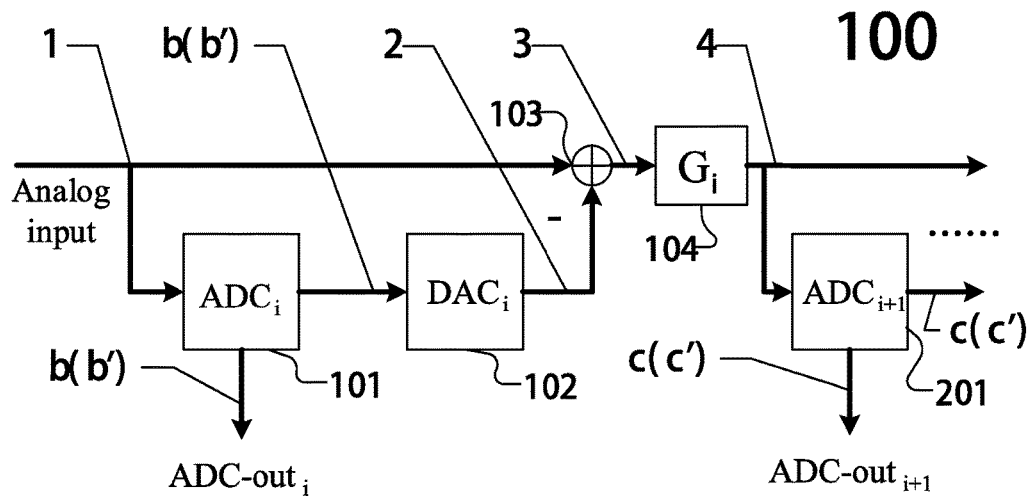
FIG. 1 is a basic structure diagram of a pipelined analog-to-digital converter (Pipeline ADC) in the prior art.
Figure 2:
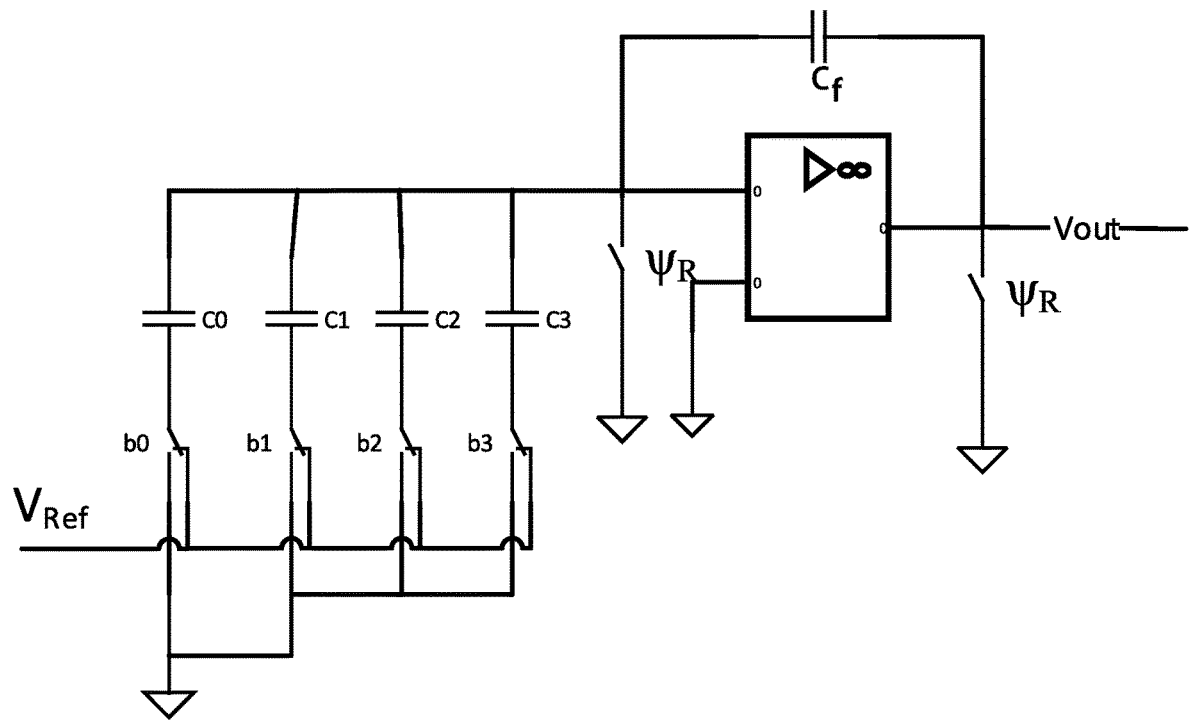
FIG. 2 is a structure diagram of a Obit capacitor digital-to-analog converter (DAC) in the prior art.

FIG. 1 shows previous and next pipeline stages in the existing pipelined analog-to-digital converter 100. Referring to FIG. 1, the previous pipeline stage is marked with i, while the next pipeline stage is marked with i+1, wherein 1≤i≤N, N is a number of the pipeline stages, and N≥1. $V_{in}$ represents a voltage value of an input analog signal 1 (Analog input) of the $i^{th}$ pipeline stage, an output of the sub-analog-to-digital converter 101 of the $i^{th}$ pipeline stage is a code b, and meanwhile, the code b is also an input of the sub-digital-to-analog converter 102 of the $i^{th}$ pipeline stage 102, wherein $0 \leq b \leq 2^k-1$, and k is a binary digit of the code of the $i^{th}$ pipeline stage; $DAC_i(b)$ represents an output 2 of the sub-digital-to-analog converter 102 of the $i^{th}$ pipeline stage after converting the input code b into an analog quantity, $V_{in}-DAC_i(b)$ is a quantization residual 3 outputted by the subtractor 103 of the $i^{th}$ pipeline stage, $V_{res}$ is a voltage value of an analog signal 4 outputted by the $i^{th}$ pipeline stage, and G is an ideal inter-stage gain value of the inter-stage gain amplifier $G_1$ of the $i^{th}$ pipeline stage.

For the $i^{th}$ pipeline stage of the pipelined analog-to-digital converter, in the case of no errors, a signal input and output formula of the $i^{th}$ pipeline stage is as follows:

$$V_{res}=(V_{in}-DAC_i(b))*G \qquad (1)$$

The code outputted by the sub-analog-to-digital converter 201 of the $(i+1)^{th}$) pipeline stage is as follows:

$$c=ADC_{i+1}(V_{res}) \qquad (2)$$

wherein, $ADC_{i+1}(V_{res})$ represents that the sub-analog-to-digital converter of the $(i+1)^{th}$ pipeline stage converts the analog quantity voltage value $V_{res}$ into a digital quantity.

In the presence of capacitor mismatch and inter-stage gain errors, the voltage value of the analog signal 4 outputted by the $i^{th}$ pipeline stage is represented by $V'_{res}$, the actual inter-stage gain value of the inter-stage gain amplifier $G_1$ is represented by $G'$ and the codes output by the sub-analog-to-digital converters 101 and 201 are expressed by b' and c', then signal input and output formulae of the $i^{th}$ pipeline stage are as follows:

$$\begin{aligned} V_{res}' &= (V_{in} - (DAC_i(b') + \varepsilon(b')))*G' \qquad (3) \\ &= (V_{in} - DAC_i(b'))*G' - \varepsilon(b')*G' \\ &= V_{res}*G'/G - \varepsilon(b')*G' \end{aligned}$$

The code outputted by the sub-analog-to-digital converter 201 of the $(i+1)^{th}$ $$\begin{aligned} c' &= ADC_{i+1}(V_{res}') \qquad (4) \\ &= ADC_{i+1}(V_{res}*G'/G - \varepsilon(b')*G') \\ &= ADC_{i+1}(V_{res})*G'/G - ADC_{i+1}(\varepsilon(b'))*G' \\ &= c*G'/G - ADC_{i+1}(\varepsilon(b'))*G' \end{aligned}$$

wherein, $\varepsilon(b')$ is a capacitor mismatch value when the input code of the sub-analog-to-digital converter 102 is zero. It can be seen that the errors caused by the capacitor mismatch and inter-stage gain can be corrected by estimating $ADC_{i+1}(\varepsilon(b'))*G'$ and $G'$.

Figure 3:
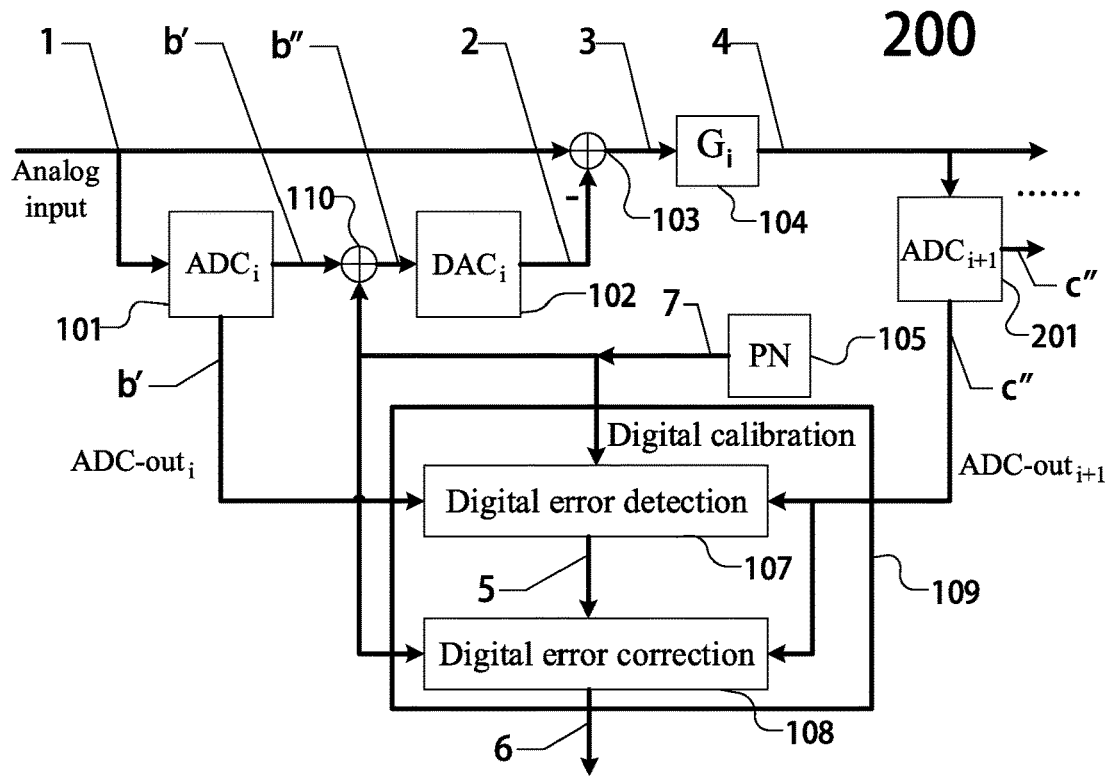
FIG. 3 is a basic schematic diagram of a pipelined analog-to-digital converter with a PN code injected in a digital domain according to the disclosure.
Figure 4:
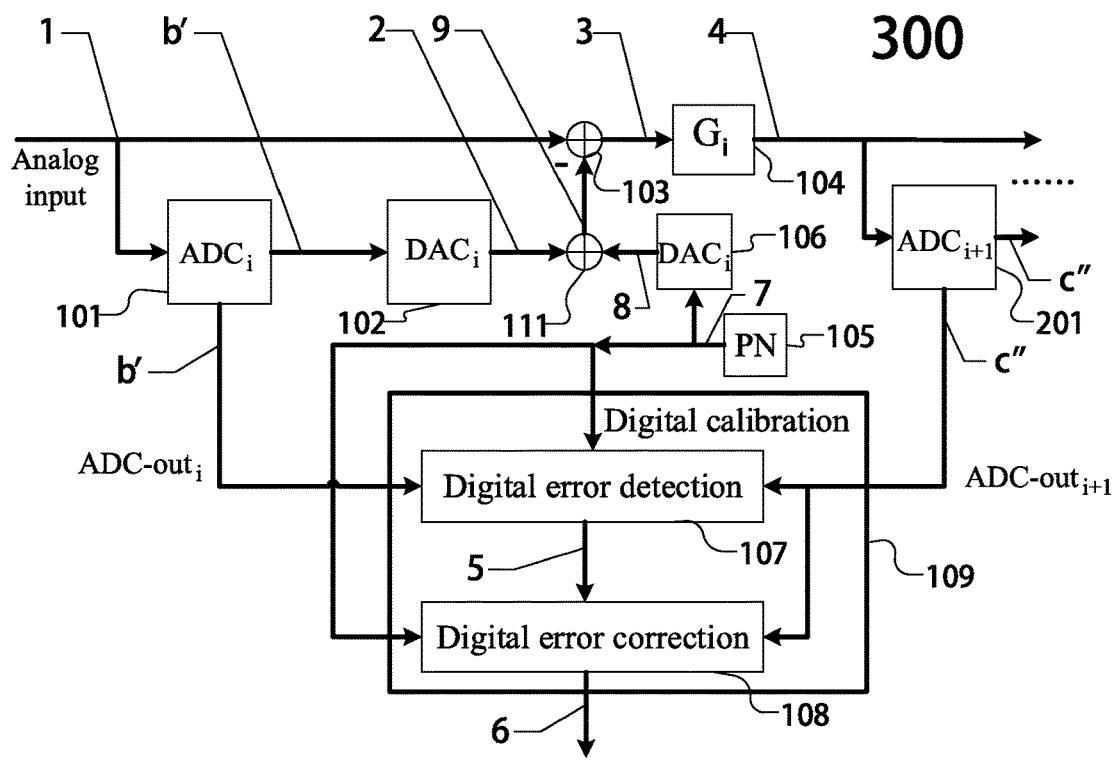
FIG. 4 is a basic schematic diagram of a pipelined analog-to-digital converter with a PN code injected in an analog domain according to the disclosure.

FIG. 3 and FIG. 4 respectively represent two specific embodiments 200 and 300 of the pipelined analog-to-digital converter capable of correcting capacitor mismatch and inter-stage gain errors according to the disclosure. Basic principles of the pipelined analog-to-digital converter according to the disclosure for performing capacitor mismatch and inter-stage gain error correction by injecting PN codes in a digital domain and in an analog domain are explained below. Referring to FIG. 3 and FIG. 4, the previous pipeline stage is marked with i, while the next pipeline stage is marked with i+1, wherein $1 \leq i \leq N-1$. The PN code injected in the digital domain means that the PN code is inputted into the $i^{th}$ pipeline stage in a digital signal mode, while the PN code injected in the analog domain means that the PN code is inputted into the $i^{th}$ pipeline stage in an analog signal mode. A value of the PN code in the digital domain is +1 or −1, and an increase or decrease amplitude in the analog domain is an amplitude of a least significant bit of the sub-analog-to-digital converter of the $i^{th}$ pipeline stage after being converted by the digital-to-analog converter of the $i^{th}$ pipeline stage. In FIG. 3, a digital output of the PN code generator 105 is 7, i.e., the PN code is added with the code b outputted by the sub-analog-to-digital converter 101 through an adder 110, and an input code of the sub-digital-to-analog converter 102 becomes b"=b'+PN. In FIG. 4, a digital output of the PN code generator 105 is 7, i.e., the PN code is transformed to the analog domain through the digital-to-analog converter 106, and is added with the code 2 outputted by the sub-analog-to-digital converter 102 through an adder 111, i.e. the PN code is added with $DAC_i(b')$, and an output 9 of the adder 111 is $DAC_i(b')+DAC_i(PN*(1+\varepsilon_c))$, wherein $\varepsilon_c$ is an error brought by PN code injection, $\varepsilon_c=0$ during digital domain injection, and $\varepsilon_c$ is generally in an order of magnitude of 1% in the analog domain, and the fact that $\varepsilon_c$ can also satisfy spurious-free dynamic range (SFDR) requirements for some high-speed high-precision analog-to-digital converters is ignored.

No matter the PN code is injected in the analog domain or in the digital domain, when the code output by the sub-analog-to-digital converter 101 of the $i^{th}$ pipeline stage is b', a voltage value of the analog signal 4 outputted by the $i^{th}$ pipeline stage is as follows:

$$\begin{aligned} V_{res}''|_{b'} &= (V_{in} - (DAC_i(b') + DAC_i(PN*(1+\varepsilon_c)) + \varepsilon(b')))*G' \qquad (5) \\ &= (V_{in} - DAC_i(b'))*G' - DAC_i(PN*(1+\varepsilon_c))*G' - \varepsilon(b')*G' \end{aligned}$$

The code outputted by the sub-analog-to-digital converter 201 of the $(i+1)^{th}$ pipeline stage is, as follows:

$$\begin{aligned} c'' &= ADC_{i+1}(V_{res}''|_{b'}) \qquad (6) \\ &= ADC_{i+1}((V_{in} - DAC_i(b'))*G' - DAC_i(PN*(1+\varepsilon_c))*G' - \varepsilon(b')*G') \\ &= ADC_{i+1}((V_{in} - DAC_i(b')))*G' - PN*(1+\varepsilon_c)*G' - ADC_{i+1}(\varepsilon(b'))*G' \\ &= c*G'/G - PN*(1+\varepsilon_c)*G' - ADC_{i+1}(\varepsilon(b'))*G' \\ &\approx c*G'/G - PN*G' - ADC_{i+1}(\varepsilon(b'))*G' \end{aligned}$$

On the premise that the code outputted by the sub-analog-to-digital converter 101 of the $i^{th}$ pipeline stage is b', when the PN code is +1 and −1, the mean values of the codes c" outputted by the sub-analog-to-digital converter 201 of the next pipeline stage are respectively as follows:

$$E(ADC_{i+1}(V_{res}''|_{b',PN=+1})) = E(ADC_{i+1}((V_{in} - DAC_i(b'))*G' - (1+\varepsilon_c)*G' - \varepsilon(b')*G')) \quad (7)$$
$$= E(ADC_{i+1}((V_{in} - DAC_i(b'))*G')) - E((1+\varepsilon_c)*G') - E(ADC_{i+1}(\varepsilon(b'))*G')$$
$$= -(1+\varepsilon_c)*G' - E(ADC_{i+1}(\varepsilon(b')))*G'$$

$$E(ADC_{i+1}(V_{res}''|_{b',PN=+1})) = E(ADC_{i+1}((V_{in} - DAC_i(b'))*G' + (1+\varepsilon_c)*G' - \varepsilon(b')*G')) \quad (8)$$
$$= E(ADC_{i+1}((V_{in} - DAC_i(b'))*G')) + E((1+\varepsilon_c)*G') - E(ADC_{i+1}(\varepsilon(b'))*G')$$
$$= (1+\varepsilon_c)*G' - E(ADC_{i+1}(\varepsilon(b')))*G'$$

wherein, $E((1+\varepsilon_c)*G')=(1+\varepsilon_c)*G'$; a mean residual is 0, and $E(ADC_{i+1}((V_{in}-DAC_i(b'))*=0$; therefore, by adding and subtracting the two mean values, the followings can be obtained:

$$E(ADC_{i+1}(V_{res}''|_{b',PN=+1})) + E(ADC_{i+1}(V_{res}''|_{b',PN=-1})) = -2*E(ADC_{i+1}(\varepsilon(b')))*G' \quad (9)$$

$$E(ADC_{i+1}(V_{res}''|_{b',PN=+1})) - E(ADC_{i+1}(V_{res}''|_{b',PN=-1})) = 2*(1+\varepsilon_c)*G' \approx 2*G' \quad (10)$$

It can be seen that, on the premise that the code outputted by the sub-analog-to-digital converter 101 of the $i^{th}$ pipeline stage is b', the mean values c" of the codes outputted by the sub-analog-to-digital converter 201 of the $(i+1)^{th}$ pipeline stage when the PN code is +1 and −1 are counted respectively, so that $E(ADC_{i+1}(\varepsilon(b'))*G'$ and G' can be estimated, and then $E(ADC_{i+1}(\varepsilon(b'))*G'$ is used as the estimation of $E(ADC_{i+1}(\varepsilon(b'))*G'$, that is, the code c in an ideal state can be obtained by correcting the errors caused by performing capacitor mismatch and inter-stage gain on the code c" according to the formula (6).

$$G' \approx (E(ADC_{i+1}(V_{res}''|_{b',PN=-1})) - E(ADC_{i+1}(V_{res}''|_{b',PN=+1})))/2 \quad (11)$$

$$E(ADC_{i+1}(\varepsilon(b')))*G' = -(E(ADC_{i+1}(V_{res}''|_{b',PN=+1})) + E(ADC_{i+1}(V_{res}''|_{b',PN=-1})))/2 \quad (12)$$

To facilitate circuit design, the following can be defined:

$$\varepsilon'(b') = -E(ADC_{i+1}(\varepsilon(b')))*G' = (E(ADC_{i+1}(V_{res}''|_{b',PN=+1})) + E(ADC_{i+1}(V_{res}''|_{b',PN=-1})))/2 \quad (13)$$

Based on the above principles, the pipelined analog-to-digital converter provided by the disclosure comprises a digital correction circuit, wherein the digital correction circuit receives the PN code, the code outputted by the sub-analog-to-digital converter of the $i^{th}$ pipeline stage and the code outputted by the sub-analog-to-digital converter of the $(i+1)^{th}$ pipeline stage, counts a mean value of the code outputted by the sub-analog-to-digital converter of the (i+1) $^{th}$ pipeline stage in two cases that the PN code is equal to +1 and the PN code is equal to −1 under the condition that an output of the sub-analog-to-digital converter of the $i^{th}$ pipeline stage is a specific code b, wherein b represents the code of the $i^{th}$ pipeline stage, k is a digit of the code of the $i^{th}$ pipeline stage, and $0 \leq b \leq 2^k-1$, and estimates a capacitor mismatch error and an actual inter-stage gain of the $i^{th}$ pipeline stage according to the mean value and corrects the code outputted by the sub-analog-to-digital converter of the $(i+1)^{th}$ pipeline stage.

A specific embodiment of the digital correction circuit comprises an error detection circuit and an error correction circuit. The error detection circuit is used for counting the mean value of the codes outputted by the sub-analog-to-digital converter of the $(i+1)^{th}$ pipeline stage in the two cases that the PN code is +1 and the PN code is −1 under the condition that the output of the sub-analog-to-digital converter of the $i^{th}$ pipeline stage is a specific code b, and estimating the capacitor mismatch error and the actual inter-stage gain of the $i^{th}$ pipeline stage according to the mean value; and the error detection circuit is used for correcting the code outputted by the sub-analog-to-digital converter of the $(i+1)^{th}$ pipeline stage.

Figure 5:
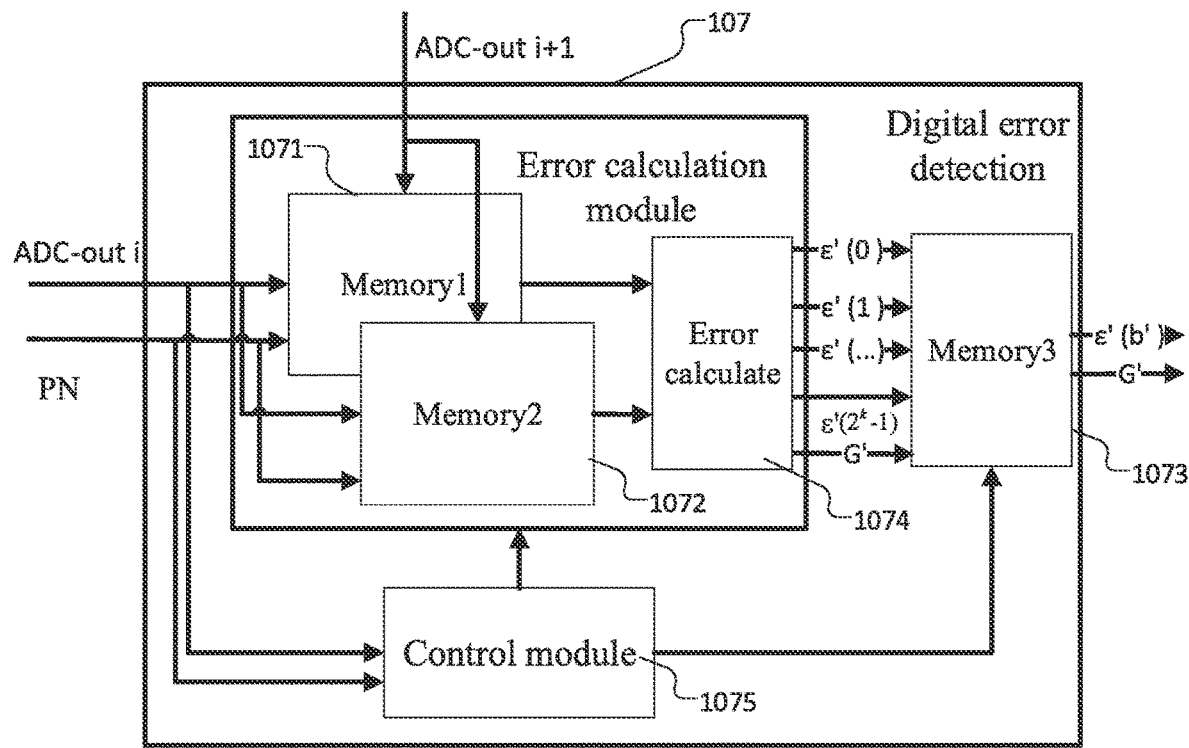
FIG. 5 is a specific embodiment of an error detection circuit in a digital correction circuit according to the disclosure.

FIG. 5 is a specific embodiment of an error detection circuit in a digital correction circuit according to the disclosure. As shown in FIG. 5, the error detection circuit 107 comprises a first memory 1071, a second memory 1072, a third memory 1073, an error calculation module 1074 and a control module 1075. In a first accumulated time period t1, under the control of the control module 1075, the PN code equal to +1 is taken as a chip select signal of the first memory 1071, and the code outputted by the sub-analog-to-digital converter of the $(i+1)^{th}$ pipeline stage when the PN code is equal to +1 is stored in a row taking the code outputted by the sub-analog-to-digital converter of the $i^{th}$ pipeline stage as a row address in the first memory 1071. The PN code equal to −1 is taken as a chip select signal of the second memory 1072, and the code outputted by the sub-analog-to-digital converter of the $(i+1)^{th}$ pipeline stage when the PN code is equal to −1 is stored in a row taking the code outputted by the sub-analog-to-digital converter of the $i^{th}$ pipeline stage as a row address in the second memory 1072. The error calculation module 1074 reads the first memory 1071 and the second memory 1072 at a first time interval under the control of the control module 1075, calculates a mean value of codes in each row of the first memory 1071 and a mean value of codes in each row of the second memory 1072, estimates the capacitor mismatch error ε'(b') and the actual inter-stage gain G' by using the two mean values with the same row address of the first memory 1071 and the second memory 1072, and stores the capacitor mismatch error ε'(b') and the actual inter-stage gain G' in the third memory 1073 for the error correction circuit to call. The control module 1075 is used for controlling a duration for the first memory 1071 and the second memory 1072 to store the sub-analog-to-digital converter of the $(i+1)^{th}$ pipeline stage according to the first accumulated time, and controlling a frequency for the error calculation module 1074 to calculate and update the capacitor mismatch error and the actual inter-stage gain according to the first time interval t2, and a frequency for updating the capacitor mismatch error and the actual inter-stage gain in the third memory 1073.

The errors caused by performing capacitor mismatch and inter-stage gain on the code c" can be corrected according to an inverse operation of the formula (6), i.e., formula (14), so that the code c in an ideal state can be obtained.

$$c = (c'' + ADC_{i+1}(\varepsilon(b'))^*G' + PN^*G')G/G' = \quad (14)$$
$$(c'' - \varepsilon'(b') + PN^*G')G/G'$$

Figure 6:
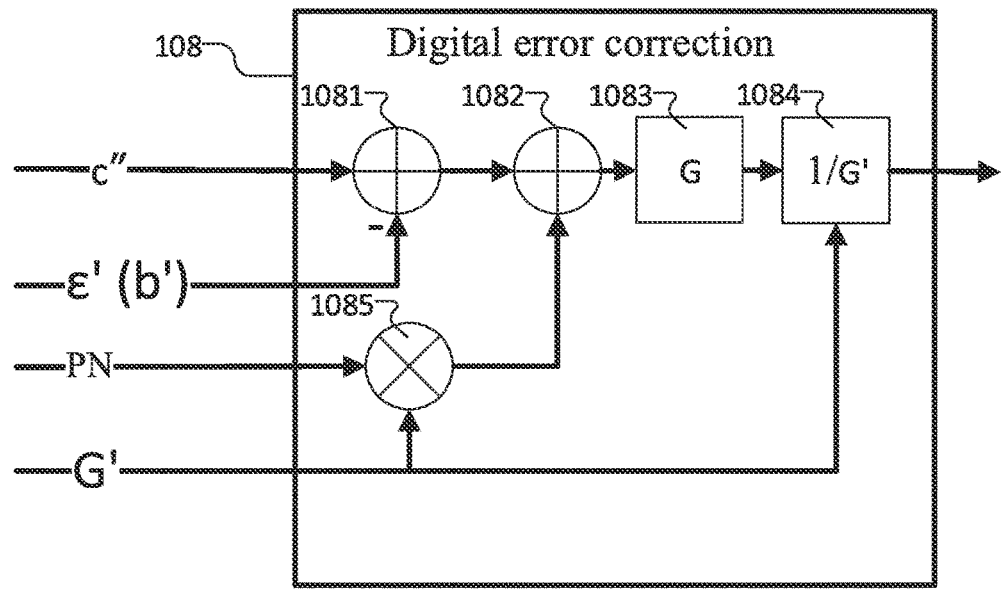
FIG. 6 is a specific embodiment of an error detection circuit in a digital correction circuit according to the disclosure.

FIG. 6 is a specific embodiment of an error detection circuit in a digital correction circuit according to the disclosure. The error correction circuit 108 comprises a subtractor 1081, an adder 1082, an amplifier 1083, a divider 1084 and a multiplier 1085. An amplification factor of the amplifier 1083 is an ideal inter-stage gain G, and a divisor of the divider 1084 is an actual inter-stage gain G'. The code c" outputted by the sub-analog-to-digital converter of the $(i+1)^{th}$ pipeline stage and the capacitor mismatch error $\varepsilon'(b')$ are respectively sent to a minuend terminal and a subtrahend terminal of the subtractor 1081, and a result of subtraction is sent to the adder 1082. The PN code and the actual inter-stage gain G' are sent to the multiplier 1085 for multiplication, and then sent to the adder 1082; the two are added in the adder 1082, and pass through the amplifier 1083 and the divider 1084, then the corrected code C is outputted.

Taking a pipelined analog-to-digital converter with two pipeline stages an example, a first pipeline stage is 6 bit, a second pipeline stage is 8 bit, and an inter-stage gain is 16. Therefore, an input code range b' of a sub-digital-to-analog converter of the first pipeline stage is 0 to 63, and a quantization code range of a sub-analog-to-digital converter of the second pipeline stage is 0 to 255.

Taking input codes 0-63 of the sub-digital-to-analog converter DAC1 of the first pipeline stage as an example, quantized codes of the sub-analog-to-digital converter of the second pipeline stage are recorded into the first memory when PN=1, and quantized codes of the sub-analog-to-digital converter of the second pipeline stage are recorded into the second memory when PN=−1, and an accumulated time t1 which is a clock period of 262144 (256*64*16) sub-analog-to-digital converters (ADC) is recorded. A mean value of each row of the first memory and a mean value of each row of the second memory are calculated, and the capacitor mismatch error and the actual inter-stage gain are calculated according to the obtained mean values. Since the actual inter-stage gain is irrelevant to the input code b' of the sub-digital-to-analog converter in the first pipeline stage, the actual inter-stage gain obtained from the mean value of one row therein may be used as the actual inter-stage gain for correction. The actual inter-stage gain G'(b') calculated by the mean value of each row may also be averaged to obtain the actual inter-stage gain value $$G' = \frac{1}{64}\sum_{b'=0}^{63} G'(b')$$

for correction, wherein the latter is employed in this embodiment.

The error caused by the capacitor mismatch is related to the input code b' of the sub-digital-to-analog converter in the first-stage pipeline structure, so $\varepsilon'(b')$ is the capacitor mismatch error when the sub-digital-to-analog converter in the current pipeline stage inputs the code b'. Different capacitor mismatch errors $\varepsilon'(b')$ are used for correction according to different input codes b', and 64 $\varepsilon'(b')$ values and one G' value are stored. The control module in the error detection circuit outputs G' and the corresponding $\varepsilon'(b')$ to the error correction circuit for correction according to the values of b'. The control module in the error detection circuit sets the interval t2 to 60 seconds, that is, the interval for calculating and updating 64 $\varepsilon'(b')$ values and one G' value in the memory is 60 seconds, so as to track the capacitor mismatch and inter-stage gain error of the digital-to-analog converter with time.

Through the above corrections, the spurious-free dynamic range SFDR of the pipelined analog-to-digital converter can reach above 75 dB.

The above are only preferred embodiments of the disclosure, and are not intended to limit the disclosure. Any modification, equivalent substitution and improvement made within the ideological principle of the disclosure shall be included in the protection scope of the disclosure.

What is claimed is:

1. A pipelined analog-to-digital converter, comprising a PN code injection module, a digital correction circuit and a plurality of pipeline stages which are coupled in a cascade mode, wherein each pipeline stage comprises a sub-analog-to-digital converter, a sub-digital-to-analog converter and an inter-stage gain amplifier, and the sub-digital-to-analog converter is of a binary code type;

a PN code generator and a digital correction circuit are arranged between every two adjacent pipeline stages; the previous pipeline stage is an $i^{th}$ stage of the pipelined analog-to-digital converter, and the adjacent next pipeline stage is an $(i+1)^{th}$ stage of the pipelined analog-to-digital converter, wherein $1 \le i \le N$, N is a number of the pipeline stages, and $N \ge 1$; and both a number of the PN code generator and a number of the digital correction circuit are N;

the PN code generator between the $i^{th}$ pipeline stage and the $(i+1)^{th}$ pipeline stage is used for randomly generating a PN code and inputting the PN code into the $i^{th}$ pipeline stage, wherein a numerical value of the PN code is +1 or −1; and the PN code is inputted into the $i^{th}$ pipeline stage in a digital signal mode or in an analog signal mode;

if the PN code is inputted into the $i^{th}$ pipeline stage in the digital signal mode, the sub-analog-to-digital converter of the $i^{th}$ pipeline stage converts an analog input signal of the $i^{th}$ pipeline stage into a code, and a digital signal obtained by adding the PN code outputted by the PN code generator and the code outputted by the sub-analog-to-digital converter of the $i^{th}$ pipeline stage serves as an input signal of the sub-digital-to-analog converter of the $i^{th}$ pipeline stage, and a difference between the analog input signal of the $i^{th}$ pipeline stage and an analog output signal of the sub-digital-to-analog converter of the $i^{th}$ pipeline stage after being amplified by the inter-stage gain amplifier of the $i^{th}$ pipeline stage is outputted to the $(i+1)^{th}$ pipeline stage and serves as an analog input signal of the $(i+1)^{th}$ pipeline stage;

if the PN code is inputted into the $i^{th}$ pipeline stage in the analog signal mode, the sub-analog-to-digital converter of the $i^{th}$ pipeline stage converts the analog input signal of the $i^{th}$ pipeline stage into a code and outputs the code to the sub-digital-to-analog converter of the $i^{th}$ pipeline stage; the analog input signal of the $i^{th}$ pipeline stage minus the analog output signal of the sub-digital-to-analog converter of the $i^{th}$ pipeline stage is a quantization residual of the $i^{th}$ pipeline stage, and an analog signal obtained by performing digital-to-analogue conversion on the PN code outputted by the PN code generator is inputted into the $i^{th}$ pipeline stage to increase or decrease the quantization residual, wherein an increase or decrease amplitude is an amplitude of a least significant bit of the sub-analog-to-digital converter of the $i^{th}$ pipeline stage after being converted by the inter-stage gain amplifier and serves as the analog input signal of the $(i+1)^{th}$ pipeline stage; and the digital correction circuit receives the PN code outputted by the PN code generator, the code outputted by the sub-analog-to-digital converter of the $i^{th}$ pipeline stage and the code outputted by the sub-analog-to-digital converter of the $(i+1)^{th}$ pipeline stage, counts a mean value of the codes outputted by the sub-analog-to-digital converter of the $(i+1)^{th}$ pipeline stage in two cases that the PN code is equal to +1 and the PN code is equal to −1 under the condition that an output of the sub-analog-to-digital converter of the $i^{th}$ pipeline stage is a code b, wherein b represents the code outputted by the sub-analog-to-digital converter of the $i^{th}$ pipeline stage, k is a binary digit of the code outputted by the sub-analog-to-digital converter of the $i^{th}$ pipeline stage, and $0 \leq b \leq 2^k-1$, and estimates a capacitor mismatch error and an actual inter-stage gain of the $i^{th}$ pipeline stage according to the mean value of the codes outputted by the sub-analog-to-digital converter of the $(i+1)^{th}$ pipeline stage and a relationship between the capacitor mismatch error and the actual inter-stage gain error of the $i^{th}$ pipeline stage, and performing capacitor mismatch and inter-stage gain error correction on the code outputted by the sub-analog-to-digital converter of the $(i+1)^{th}$ pipeline stage by employing the capacitor mismatch error and the actual inter-stage gain obtained.

2. The analogue-to-digital converter according to claim 1, wherein the digital correction circuit comprises an error detection circuit and an error correction circuit, the error detection circuit is used for counting the mean value of the codes outputted by the sub-analog-to-digital converter of the $(i+1)^{th}$ pipeline stage in the two cases that the PN code is equal to +1 and the PN code is equal to −1 under the condition that an output of the sub-analog-to-digital converter of the $i^{th}$ pipeline stage is a code b, and estimating the capacitor mismatch error and the actual inter-stage gain of the $i^{th}$ pipeline stage according to the mean value of the codes outputted by the sub-analog-to-digital converter of the $(i+1)^{th}$ pipeline stage and the relationship between the capacitor mismatch error and the actual inter-stage gain error of the $i^{th}$ pipeline stage; and the error correction circuit is used for performing the capacitor mismatch and inter-stage gain error correction on the code outputted by the sub-analog-to-digital converter of the (i+1)' pipeline stage by employing the capacitor mismatch error and the actual inter-stage gain obtained by the error detection circuit.

3. The analogue-to-digital converter according to claim 2, wherein:

the error detection circuit comprises a first memory, a second memory, a third memory, an error calculation module and a control module; in a first accumulated time period, under the control of the control module, the PN code equal to +1 is taken as a chip select signal of the first memory, and the code outputted by the sub-analog-to-digital converter of the $(i+1)^{th}$ pipeline stage when the PN code is equal to +1 is stored in a row taking the code outputted by the sub-analog-to-digital converter of the $i^{th}$ pipeline stage as a row address in the first memory; the PN code equal to −1 is taken as a chip select signal of the second memory, and the code outputted by the sub-analog-to-digital converter of the $(i+1)^{th}$ pipeline stage when the PN code is equal to −1 is stored in a row taking the code outputted by the sub-analog-to-digital converter of the $i^{th}$ pipeline stage as a row address in the second memory; the error calculation module reads the first memory and the second memory at a first time interval under the control of the control module, calculates a mean value of codes in each row of the first memory and a mean value of codes in each row of the second memory, estimates the capacitor mismatch error and the actual inter-stage gain by using the two mean values with the same row address of the first memory and the second memory, and stores the capacitor mismatch error and the actual inter-stage gain in the third memory for the error correction circuit to call; and the control module is used for controlling a duration for the first memory and the second memory to store the sub-analog-to-digital converter of the $(i+1)^{th}$ pipeline stage according to the first accumulated time, and controlling a frequency for the error calculation module to calculate and update the capacitor mismatch error and the actual inter-stage gain according to the first time interval.

4. The analogue-to-digital converter according to claim 2, wherein:

the error correction circuit comprises a subtractor, an adder, a multiplier, an amplifier and a divider, wherein an amplification factor of the amplifier is equal to an ideal inter-stage gain of the inter-stage gain amplifier of the $i^{th}$ pipeline stage, and a divisor of the divider is equal to the calculated actual inter-stage gain of the inter-stage gain amplifier of the $i^{th}$ pipeline stage; the code outputted by the sub-analog-to-digital converter of the $i^{th}$ pipeline stage is sent to a minuend terminal of the subtractor, the calculated capacitor mismatch error is sent to a subtrahend terminal of the subtractor, and an output of the subtractor is sent to the adder; the PN code and the calculated actual inter-stage gain of the $i^{th}$ pipeline stage are sent to the multiplier for multiplication, and an output of the multiplier is sent to the adder and added with the output of the subtractor; and after an output of the adder passes through the amplifier and divider, the corrected code is outputted.

* * * * *